(12) United States Patent
Kuromizu

(10) Patent No.: US 9,380,732 B2
(45) Date of Patent: Jun. 28, 2016

(54) DISPLAY DEVICE COMPRISING FIRST AND SECOND HOUSING MEMBERS HAVING AN IMPELLING MEMBER ARRANGED TO IMPEL A DRIVER IC

(75) Inventor: Yasumori Kuromizu, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 460 days.

(21) Appl. No.: 13/822,300

(22) PCT Filed: Jul. 28, 2011

(86) PCT No.: PCT/JP2011/067295
§ 371 (c)(1),
(2), (4) Date: Mar. 12, 2013

(87) PCT Pub. No.: WO2012/035894
PCT Pub. Date: Mar. 22, 2012

(65) Prior Publication Data
US 2013/0169890 A1    Jul. 4, 2013

(30) Foreign Application Priority Data

Sep. 15, 2010  (JP) .................................. 2010-206290

(51) Int. Cl.
*G02F 1/1335* (2006.01)
*H05K 7/20* (2006.01)
(Continued)

(52) U.S. Cl.
CPC ........ *H05K 7/20409* (2013.01); *G02F 1/13452* (2013.01); *G02F 1/133308* (2013.01);
(Continued)

(58) Field of Classification Search
CPC .......... H05K 7/204209; H05K 5/0017; H04N 5/7408; G02F 1/13452; G02F 1/133382; G02F 2001/133314

USPC ............................................................. 349/63
See application file for complete search history.

(56) References Cited

U.S. PATENT DOCUMENTS

| | | | | |
|---|---|---|---|---|
| 2005/0093429 | A1* | 5/2005 | Ahn | H05K 7/20963 313/498 |
| 2005/0094052 | A1* | 5/2005 | Sakurai | G02F 1/133308 349/58 |
| 2009/0213534 | A1* | 8/2009 | Sakai | G02F 1/13452 361/679.21 |

(Continued)

FOREIGN PATENT DOCUMENTS

| | | |
|---|---|---|
| JP | 2001-352022 A | 12/2001 |
| JP | 2007-226068 A | 9/2007 |

(Continued)

OTHER PUBLICATIONS

Official Communication issued in International Patent Application No. PCT/JP2011/067295, mailed on Oct. 25, 2011.

*Primary Examiner* — Paul Lee
(74) *Attorney, Agent, or Firm* — Keating & Bennett, LLP

(57) ABSTRACT

To provide a display device capable of offering improved radiation performance of radiating heat generated from a driver IC arranged to drive a display panel. The display device (1) includes a display panel (10) arranged to display an image, a driver IC (17) electrically connected to the display panel via a connecting member (18) and arranged to drive the display panel, and a housing member that defines a case of the display device, wherein the housing member includes a first housing member (11) made from metal and attached to the display panel from a front side of the panel, and a second housing member (22) made from metal and attached to the display panel from a back side of the panel, and wherein the driver IC is held sandwiched between the first housing member and the second housing member.

11 Claims, 8 Drawing Sheets

(51) Int. Cl.
*H05K 5/00* (2006.01)
*H04N 5/74* (2006.01)
*G02F 1/1333* (2006.01)
*G02F 1/1345* (2006.01)

(52) U.S. Cl.
CPC ........ *G02F1/133382* (2013.01); *H04N 5/7408* (2013.01); *H05K 5/0017* (2013.01); *G02F 1/133385* (2013.01); *G02F 2001/13332* (2013.01); *G02F 2001/133314* (2013.01)

(56) References Cited

U.S. PATENT DOCUMENTS

2009/0237587 A1* 9/2009 Won et al. ........................ 349/58

FOREIGN PATENT DOCUMENTS

| JP | 2009-014900 A | 1/2009 |
| JP | 2011-199090 A | 10/2011 |

* cited by examiner

DISPLAY DEVICE COMPRISING FIRST AND SECOND HOUSING MEMBERS HAVING AN IMPELLING MEMBER ARRANGED TO IMPEL A DRIVER IC

TECHNICAL FIELD

The present invention relates to a display device having a configuration of effectively radiating heat generated from driver ICs that are arranged to drive a display panel, and a liquid crystal display device and a television receiving device including the same.

BACKGROUND ART

A liquid crystal display panel included in a liquid crystal display device includes a pair of substrates consisting of a thin film transistor (TFT) substrate and a color filter (CF) substrate, between which liquid crystals are filled. In the liquid crystal display device, driver ICs arranged to drive the liquid crystal display panel are mounted on the periphery of the liquid crystal display panel via flexible printed wiring boards (see PTL 1).

PTL 1 discloses a configuration that protrusions are provided on a lateral face of a metal bezel that is attached to the liquid crystal display panel so as to cover the periphery of the liquid crystal display panel, and the bezel is disposed such that the protrusions are brought into contact with the driver ICs. With this configuration, a part of heat generated from the driver ICs can be effectively radiated to the outside via the bezel that functions also as a heat radiating member (i.e., a heat radiation area is increased to increase a transfer amount of the heat to the air), which can prevent the driver ICs from malfunctioning due to a rise in temperature.

CITATION LIST

Patent Literature

PTL 1: JP2009-14900

SUMMARY OF INVENTION

Technical Problem

Electric power consumption by driver ICs increases as the size of a liquid crystal display panel increases. Thus, in a liquid crystal display device including a large liquid crystal display panel, the heat radiating structure disclosed in PTL 1 cannot sufficiently prevent a rise in temperature of driver ICs, so that the temperature could exceed an operating temperature available of the driver ICs.

An object of the invention is to overcome the problem described above and to provide a display device that is capable of offering excellent radiation performance of radiating heat generated from driver ICs that are arranged to drive a display panel, and to provide a liquid crystal display device and a television receiving device including the same.

Solution to Problem

In order to overcome the problem described above, a display device of preferred embodiments of the present invention includes a display panel arranged to display an image, a driver IC that is electrically connected to the display panel via a connecting member and arranged to drive the display panel, and a housing member that defines a case of the display device, wherein the housing member includes a first housing member that is made from metal and attached to the display panel from a front side of the panel and a second housing member that is made from metal and attached to the display panel from a back side of the panel, and wherein the driver IC is held sandwiched between the first housing member and the second housing member.

It is preferable that the driver IC is mounted on one face of the connecting member that has a sheet shape, and that the driver IC and the connecting member are held sandwiched between the first housing member and the second housing member.

It is preferable that the display device further includes a first holding member and a second holding member that are opposed to each other, that the first housing member and the first holding member are of a monolithic construction, and the second housing member and the second holding member are of a monolithic construction, and that the driver IC is held sandwiched between the first holding member and the second holding member.

Alternatively, it is preferable that the display device further includes a first heat conduction member and a second holding member that are opposed to each other, that the first heat conduction member is fixed to the first housing member, and the second housing member and the second holding member are of a monolithic construction, and that the driver IC is held sandwiched between the first heat conduction member and the second holding member.

Alternatively, it is preferable that the display device further includes a first holding member and a second heat conduction member that are opposed to each other, that the first housing member and the first holding member are of a monolithic construction, and the second heat conduction member is fixed to the second housing member, and that the driver IC is held sandwiched between the first holding member and the second heat conduction member.

Alternatively, it is preferable that the display device further includes a first heat conduction member and a second heat conduction member that are opposed to each other, that the first heat conduction member is fixed to the first housing member, and the second heat conduction member is fixed to the second housing member, and that the driver IC is held sandwiched between the first heat conduction member and the second heat conduction member.

Further, it is preferable that at least one of the first housing member and the second housing member includes an impelling member arranged to impel the driver IC toward the other housing member.

In this case, it is preferable that the impelling member defines a plate spring, which defines at least one of a portion of the first housing member and a portion of the second housing member, the portions being cut out from the first housing member and the second housing member to be in standing positions.

In addition, it is preferable that at least one of the first housing member and the second housing member includes a regulating member that is arranged to surround the driver IC to regulate movement of the driver IC.

In this case, it is preferable that at least one of the first housing member and the second housing member includes a concave member that defines the regulating member, the concave member being arranged to house the driver IC to regulate movement of the driver IC.

It is preferable that the first holding member and the second holding member each define protrusions, and that the first housing member and the first holding member are of a monolithic construction, and the second housing member and the second holding member are of a monolithic construction.

Further, it is preferable that a face of the first holding member, the face being opposed to the driver IC, defines a flat face.

In addition, it is preferable that a face of the second holding member, the face being opposed to the driver IC, defines a flat face.

In addition, it is preferable that a face of the first heat conduction member, the face being opposed to the driver IC, defines a flat face.

In addition, it is preferable that a face of the second heat conduction member, the face being opposed to the driver IC, defines a flat face.

It is preferable that the display device of the present invention defines a liquid crystal display device, and the display panel defines a liquid crystal display panel.

In this case, it is preferable that the first housing member defines a bezel arranged to cover at least lateral faces of the liquid crystal display panel, and the second housing member defines a backlight chassis that is arranged to house an illuminating device that is arranged to emit light from a back side of the liquid crystal display panel.

In another aspect of the present invention, a television receiving device of the present invention includes the liquid crystal display device described above.

Advantageous Effects of Invention

Because the display device, the liquid crystal display device, and the television receiving device of the present invention have the configuration that the driver IC is held sandwiched between the first housing member and the second housing member that make up a case of the display device, that is, the configuration that apart of heat generated from the driver IC can be radiated to the outside via the first housing member and the second housing member that function also as heat radiating members, a heat transfer area between the driver IC and the heat radiating members and a heat radiation area of the heat radiating members (a transfer amount of the heat to the air) are increased compared with a conventional display device, liquid crystal display device, and television receiving device. Thus, the display device, the liquid crystal display device, and the television receiving device of the present invention are capable of offering greatly improved radiation performance. Consequently, the display device, the liquid crystal display device, and the television receiving device of the present invention are capable of preventing a rise in temperature of the driver IC to prevent the driver IC from malfunctioning due to heat. In addition, because the driver IC is sandwiched between the first housing member and the second housing member in a stable manner so as not to sway greatly even if vibrations are generated, the possibility of a breakdown caused to the driver IC by a shock given to the display device can be decreased.

In addition, though the connecting member exists between the first housing member and the second housing member in the configuration that the driver IC is mounted on one face of the sheet-shaped connecting member (e.g., a flexible printed wiring board), the heat radiation efficiency of at least one of the first housing member and the second housing member can be maintained (i.e., no connecting member exists between one housing member and the driver IC while the connecting member exists between the other housing member and the driver IC), so that the heat radiation efficiency in radiating the heat generated from the driver IC can be prevented from being remarkably reduced.

It is preferable that the driver IC is held by the first holding member of the first housing member and the second holding member of the second housing member (i.e., the driver IC is directly held by the first housing member and the second housing member). Alternatively, it is preferable that the driver IC is held by the first holding member of the first housing member and the second holding member of the second housing member while a heat conduction member such as a sheet having high heat conductivity is sandwiched therebetween (i.e., the driver IC is indirectly held by the first housing member and the second housing member). In the first case, the production cost can be kept down. In the latter case, the heat radiation efficiency can be improved by using a heat conduction member having heat conductivity higher than the first housing member and the second housing member.

When at least one of the first housing member and the second housing member includes the impelling member arranged to impel the driver IC toward the other housing member, a force exerted on the driver IC sandwiched by the first housing member and the second housing member increases, so that the driver IC can be held in a more stable manner. Thus, the possibility of a breakdown caused to the driver IC by a shock can be further decreased. The impelling member can be easily produced as the plate spring by cutting out at least one of a portion of the first housing member and a portion of the second housing member such that the portions stand.

When at least one of the first housing member and the second housing member includes the regulating member that is arranged to surround the driver IC to regulate movement of the driver IC, the driver IC can be held in a more stable manner, so that the possibility of a breakdown caused to the driver IC by a shock given to the display device can be further decreased in the same manner as described above. The regulating member can be easily produced by producing the concave member arranged to house the driver IC in the first housing member or the second housing member.

When the faces of the first holding member, the second holding member, the first heat conduction member and the second heat conduction member, which are opposed to the driver IC, define flat faces, heat transfer areas between the driver IC and the first holding member, the second holding member, the first heat conduction member and the second heat conduction member are increased, so that the heat radiation efficiency can be improved.

When the display device defines the liquid crystal display device, because the bezel arranged to cover the lateral faces of the liquid crystal display panel can be used as the first housing member, and the backlight chassis arranged to house the illuminating device arranged to emit light from the back side of the display panel can be used as the second housing member, housing members that are used in a conventional liquid crystal display device can be used as the heat radiating members. Thus, the production cost can be kept down while a rise in temperature of the driver IC can be prevented.

DESCRIPTION OF EMBODIMENTS

Figure 1:
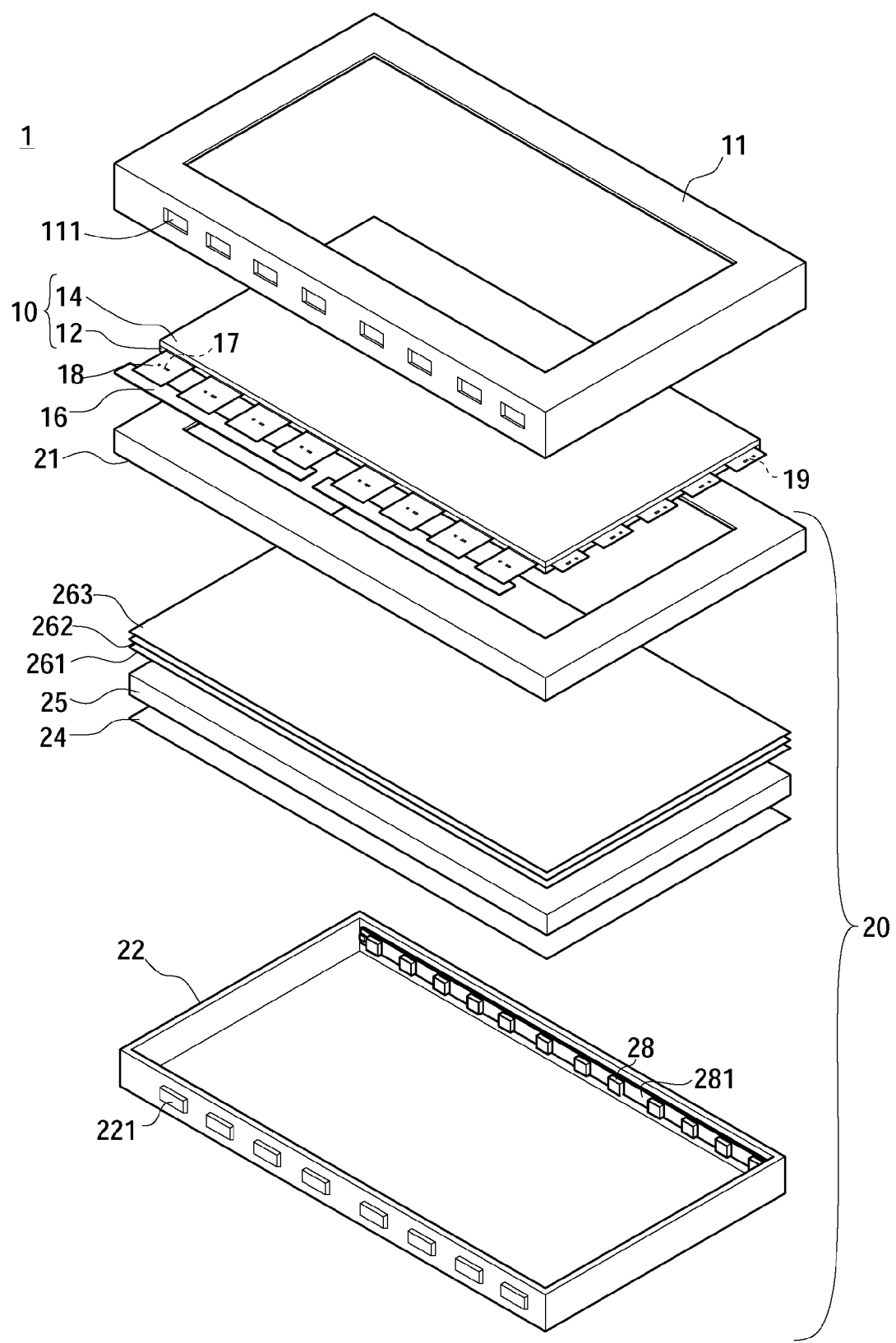
FIG. 1 is an exploded perspective view showing a liquid crystal display device of a preferred embodiment of the present invention.
Figure 2:
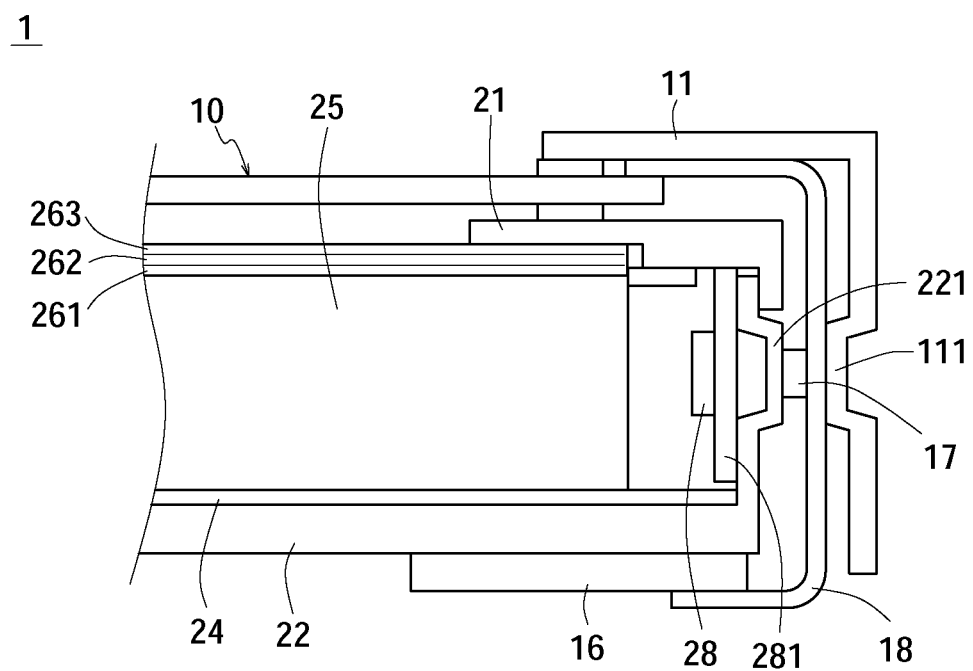
FIG. 2 is an enlarged cross-sectional view showing the liquid crystal display device shown in FIG. 1.

Hereinafter, detailed descriptions of a liquid crystal display device 1 of a preferred embodiment of the present invention will be provided with reference to the accompanying drawings. FIG. 1 is an exploded perspective view showing the liquid crystal display device 1 of the present embodiment. FIG. 2 is an enlarged cross-sectional view showing the liquid crystal display device 1 (no hatching is drawn in order to make this view clearly understandable). In the following descriptions, unless otherwise noted, a front side and an upper side refer to the tops of FIGS. 1 and 2, and a back side and a lower side refer to the bottoms of FIGS. 1 and 2. In addition, an inner side refers to a center side of the liquid crystal display device 1 that is seen in a plan view (a center side of a screen of a liquid crystal display panel 10), and an outer side of the liquid crystal display device 1 refers to the side opposite to the center side.

The liquid crystal display device 1 of the present embodiment includes the liquid crystal display panel 10 (corresponding to a display panel of the present invention), source drivers 17 (corresponding to driver ICs of the present invention) arranged to drive the liquid crystal display panel 10, an illuminating device 20, and housing members arranged to house these members.

The liquid crystal display panel 10 includes a thin film transistor, (TFT) array substrate 12 (hereinafter, referred to simply as the array substrate 12) and a color filter (CF) substrate 14, and is fixed by a bezel 11 that defines one of the housing members (the bezel 11 corresponds to a first housing member of the present invention) as shown in FIG. 1.

In the liquid crystal display panel 10, the array substrate 12 and the color filter substrate 14 are opposed to each other having a given cell gap therebetween, in which liquid crystals are filled.

The array substrate 12 defines a glass substrate on which TFTs and pixel electrodes are arranged in a matrix. Gate signal lines and source signal lines are arranged in a lattice pattern between the TFTs and the pixel electrodes. The pixel electrodes are electrically connected to drain electrodes of the TFTs, the source signal lines are electrically connected to source electrodes of the TFTs, and the gate signal lines are electrically connected to gate electrodes of the TFTs. The color filter substrate 14 defines a glass substrate same in size as the array substrate 12, on which a plurality of color filters are arranged in a matrix, and over the entire surface of which a transparent common electrode is formed. By varying a voltage applied to the pixel electrodes and the common electrode, alignment of the liquid crystals filled between the substrates is controlled.

The bezel 11 is made from metal to have a frame shape. It is preferable that the bezel 11 is made from a metal material having high heat conductivity because the bezel 11 defines one of members that construct a heat radiating structure arranged to prevent a rise in temperature of the source drivers 17, which will be described below. The bezel 11 is preferably made of aluminum (an aluminum alloy). The bezel 11 is attached from the front side of the liquid crystal display panel 10 to cover the periphery of the front face, and the lateral faces of the liquid crystal display panel 10.

A source board 16 that defines a drive board for the liquid crystal display panel 10 is attached to one lateral face of the liquid crystal display panel 10 via flexible printed wiring boards 18 (corresponding to a connecting member of the present invention). The source board 16 is attached to the back face of a backlight chassis 22 to be described later by bending the flexible printed wiring boards 18 so as to wrap (so as to oppose) the lateral face of the liquid crystal display panel 10 as shown in FIG. 2. In the present embodiment, the source board 16 consists of two source boards that are right and left as facing the liquid crystal display panel 10; however, the present invention is not limited to this configuration.

The source drivers 17 are mounted on the flexible printed wiring boards 18, and are disposed lateral to the liquid crystal display panel 10. The source drivers 17 are arranged to supply source signals to drive the liquid crystal display panel 10 to the source electrodes. In the present embodiment, a configuration arranged to prevent a rise in temperature of the source drivers 17 (a heat radiating structure arranged to prevent a rise in temperature of the source drivers 17) is constructed from the housing members. A detailed description of the configuration will be described later.

The illuminating device 20 defines a backlight device disposed behind the liquid crystal display panel 10. An LED backlight including LED light sources 28 as its light sources is used as the illuminating device 20 of the present embodiment. The LED light sources 28 are disposed so as to be along two opposing lateral faces of the liquid crystal display panel 10 (so as to be along two opposing lateral faces of the backlight chassis 22). That is, the illuminating device 20 defines a so-called "edge light" backlight.

The illuminating device 20 includes a frame 21 and the backlight chassis 22 that make up the housing members, a reflection sheet 24, a light guide plate 25, optical sheets 261, 262, 263, and the LED light sources 28 as shown in FIGS. 1 and 2.

The frame 21 defines one of the housing members, and has a rectangular frame shape, where the sides which form the frame have the shape of the letter "L" in cross section. The frame 21 is arranged to hold the reflection sheet 24, the light guide plate 25, and the optical sheets 261, 262, 263, which are stacked on the backlight chassis 22, inside of the backlight chassis 22. That is, the reflection sheet 24, the light guide plate 25, and the optical sheets 261, 262, 263 are disposed in a space formed by the frame 21 and the backlight chassis 22 as shown in FIG. 2.

The backlight chassis 22 is made from metal, and has the shape of a box of low height, which is square when seen in a plan view. It is preferable that the backlight chassis 22 is made from a metal material having high heat conductivity because the backlight chassis 22 defines one of members that construct the heat radiating structure arranged to prevent a rise in temperature of the source drivers 17, which will be described below. The backlight chassis 22 is preferably made of aluminum (an aluminum alloy). The LED light sources 28 mounted on LED boards 281 are disposed on inner faces of the backlight chassis 22. To be specific, the LED light sources 28 are arranged to project light from lateral sides of the backlight chassis 22 toward the center of the backlight chassis 22. The reflection sheet 24 is laid on an inner bottom face of the chassis body 22, and the light guide plate 25 is disposed on the reflection sheet 24. The optical sheets 261, 262, 263 are disposed on the light guide plate 25.

The reflection sheet 24 is arranged to efficiently reflect the light, which is emitted from the lateral sides of the backlight chassis 22 by the LED light sources 28, toward the liquid crystal display panel 10. The light guide plate 25 on the reflection sheet 24 is arranged to planarly diffuse the light reflected by the reflection sheet 24. Using the reflection sheet 24 and the light guide plate 25 can enhance the luminance of light, which is emitted from the light sources disposed along the lateral faces of the backlight chassis 22 (the liquid crystal display panel 10) (edge light) and reaches the panel surface, and allows uniformalization of the luminance in a plane direction of the liquid crystal display panel 10.

The optical sheets 261, 262, 263 define thin resin sheets having a rectangular shape when seen in a plan view. The optical sheets 261, 262, 263 are used in combination, and the combination can be selected as appropriate in accordance with the properties required of the liquid crystal display device 1. Specific combinations of the optical sheets 261, 262, 263 include a combination of the diffusion sheet 261, the lens sheet 262 and the polarizing reflection film 263, which are disposed in this order from the bottom. The diffusion sheet 261 allows further uniformalization of the luminance in the plane direction of the light that reaches the liquid crystal display panel 10. The lens sheet 262 is arranged to gather the light that has passed through the diffusion sheet 261 to allow enhancement of the luminance of the light. The polarizing reflection film 263 is arranged to transmit polarized light in a given direction (light that is to be polarized in a given direction) while reflecting polarized light other than the polarized light in the given direction so that the light that has reached the liquid crystal display panel 10 is not absorbed by a polarizing plate attached on a photo-receiving face (a lower face) of the liquid crystal display panel 10.

The LED light sources 28 are disposed along the two opposing inner faces of the backlight chassis 22. To be specific, the plurality of LED boards 281 are disposed on the inner faces of the backlight chassis 22. The plurality of the LED light sources 28 are linearly mounted in a longitudinal direction on each LED board 281. Thus, the LED light sources 28 are disposed along the two opposing lateral faces of the backlight chassis 22, that is, along the two opposing lateral faces of the liquid crystal display panel 10 disposed in front of the illuminating device 20.

The LED light sources 28 define so-called white LEDs arranged to emit white light. A variety of white LEDs are known, and the white LEDs used in the present embodiment are not limited specifically. For example, a while LED can be used, which has a configuration such that an LED chip arranged to emit blue light is sealed with a transparent resin containing a yellow fluorescent material.

Hereinafter, a detailed description of the heat radiating structure arranged to prevent a rise in temperature of the source drivers 17, which is constructed in the liquid crystal display device 1 of the present invention, will be provided. The heat radiating structure of the present embodiment is constructed from the bezel 11 and the backlight chassis 22 that make up the housing members.

As shown in FIG. 2, the bezel 11 includes first holding members 111 on its side wall, which define protrusions that protrude toward the inner side. The first holding members 111 are opposed to the outer side faces of the source drivers 17 mounted on the flexible printed wiring boards 18. To be specific, the faces (front faces) of the first holding members 111, which are opposed to the source drivers 17, are in indirect contact with the outer side faces of the source drivers 17 (i.e., the faces of the source drivers 17, on which the source drivers 17 are mounted on the flexible printed wiring boards 18) while sandwiching the flexible printed wiring boards 18 therebetween. The faces of the first holding members 111, which are opposed to the outer side faces of the source drivers 17, are formed to be flat faces in order to increase heat transfer areas between the first holding members 111 and the source drivers 17.

Meanwhile, the backlight chassis 22 includes second holding members 221 on its side wall (opposed to the side wall of the bezel 11), which define protrusions that protrude toward the outer side. The second holding members 221 are opposed to the inner side faces of the source drivers 17 mounted on the flexible printed wiring boards 18. To be specific, the faces (front faces) of the second holding members 221, which are opposed to the source drivers 17, are in direct contact with the inner side faces of the source drivers 17 (i.e., the faces of the source drivers 17, which are opposite to the faces on which the source drivers 17 are mounted on the flexible printed wiring boards 18). The faces of the second holding members 221, which are opposed to the inner side faces of the source drivers 17, are formed to be flat faces in order to increase heat transfer areas between the second holding members 221 and the source drivers 17.

The source drivers 17 are held sandwiched between the first holding members 111 and the second holding members 221. Thus, heat generated by driving the source drivers 17 is radiated to the outside (in the air) through paths 1) to 3) as follows; path 1), through which the heat is radiated directly from the source drivers 17 to the outside by heat transfer, path 2), through which the heat is radiated from the bezel 11 to the outside through the first holding members 111 that are in indirect contact with the source drivers 17 while sandwiching the flexible printed wiring boards 18 therebetween, and path 3), through which the heat is radiated from the backlight chassis 22 to the outside through the second holding members 221 that are in direct contact with the source drivers 17.

As described above, the bezel 11 and the backlight chassis 22 that define the housing members are in contact with the source drivers 17, so that these members also function as heat radiating members arranged to radiate the heat generated from the source drivers 17 to the outside in the present embodiment. Thus, the heat transfer areas between the source drivers 17 and the heat radiating members are large, and heat radiation areas of the heat radiating members (transfer amounts of the heat to the air) are large, so that the liquid crystal display device 1 of the present embodiment is capable of offering excellent radiation performance. Consequently, the liquid crystal display device 1 of the present embodiment is capable of preventing a rise in temperature of the source drivers 17 to prevent the source drivers 17 from malfunctioning due to heat.

In addition, though the flexible printed wiring boards 18 exist between the first holding members 111 of the bezel 11 and the source drivers 17 in the present embodiment because the source drivers 17 are mounted on one-side faces of the flexible printed wiring boards 18, the heat radiation efficiency of the backlight chassis 22 can be improved as the second holding members 221 of the backlight chassis 22 are in direct contact with the source drivers 17. Even if the source drivers 17 are mounted on the other-side faces of the flexible printed wiring boards 18 (i.e., the outer side faces of the flexible printed wiring boards 18 shown in FIG. 2), the heat radiation efficiency of the bezel 11 can be improved as the first holding members 111 of the bezel 11 are in direct contact with the source drivers 17.

To be specific, though the heat radiation efficiency could be remarkably reduced due to the existence of the connecting members such as the flexible printed wiring boards 18 if the heat radiating members are disposed on only one side of the source drivers 17, the heat radiation efficiency of at least one of the bezel 11 (the first holding members 111) and the backlight chassis 22 (the second holding members 221) can be maintained high because at least one of the bezel 11 (the first holding members 111) and the backlight chassis 22 (the second holding members 221) is in direct contact with the source drivers 17.

In addition, being held sandwiched between the first holding members 111 of the bezel 11 and the second holding members 221 of the backlight chassis 22, the source drivers 17 can be prevented from swaying greatly even if vibrations are generated. Thus, there is an advantage that the possibility of a breakdown caused to the source drivers 17 by a shock can be decreased.

In addition, the first holding members 111 that define protrusions can be easily produced so as to be of a monolithic construction with the bezel 11, and the second holding members 221 that define protrusions can be easily produced so as to be of a monolithic construction with the backlight chassis 22. For example, if the bezel 11 and the backlight chassis 22 are produced through press molding process, the production cost can be kept down because the bezel 11 and the backlight chassis 22 have shapes simple enough to be molded easily through one step of a conventional press process.

Figure 3:
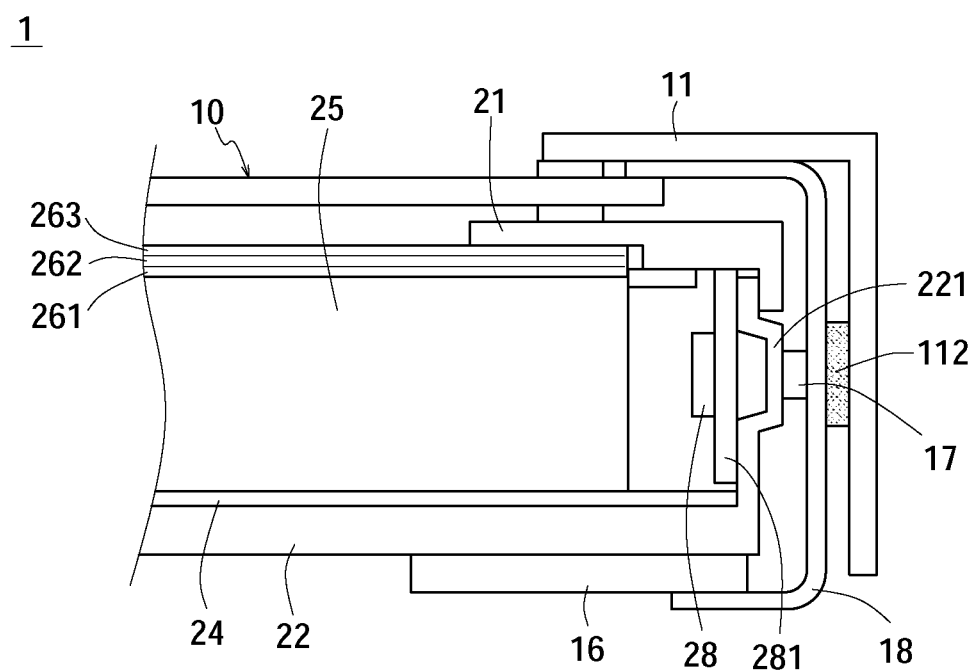
FIG. 3 is an enlarged cross-sectional view showing the liquid crystal display device of a first modification.

Hereinafter, a description of a modification of the heat radiating structure arranged to prevent a rise in temperature of the source drivers 17, which is constructed in the liquid crystal display device 1, will be provided. The first modification shown in FIG. 3 defines a configuration that while the backlight chassis 22 includes the second holding members 221 that define protrusions, the bezel 11 includes no first holding member 111 (i.e., a molding process to produce protrusions is not performed), but the bezel 11 includes a first heat conduction member 112 that is fixed to the bezel 11.

A heat conductive sheet having high heat conductivity is preferably used as the first heat conduction member 112. The configuration of the first heat conduction member 112 is not limited specifically; however, it is preferable that the heat conductive sheet has heat conductivity higher than the material from which the bezel 11 is made. The first heat conduction member 112 is opposed to the outer side faces of the source drivers 17 mounted on the flexible printed wiring boards 18. To be specific, the face (front face) of the first heat conduction member 112, which is opposed to the source drivers 17, is in indirect contact with the outer side faces of the source drivers 17 (i.e., the faces of the source drivers 17, on which the source drivers 17 are mounted on the flexible printed wiring boards 18) while sandwiching the flexible printed wiring boards 18 therebetween. The face of the first heat conduction member 112, which is opposed to the outer side faces of the source drivers 17, is formed to be a flat face in order to increase a heat transfer area between the first heat conduction member 112 and the source drivers 17.

Also in this configuration, the heat transfer areas between the source drivers 17 and the heat radiating members are large, and heat radiation areas of the heat radiating members (transfer amounts of the heat to the air) are large, so that the liquid crystal display device 1 is capable of offering excellent radiation performance. Consequently, the liquid crystal display device 1 having this configuration is capable of preventing a rise in temperature of the source drivers 17 to prevent the source drivers 17 from malfunctioning due to heat. In addition, being held sandwiched between the first heat conduction member 112 fixed to the bezel 11 and the second holding members 221 of the backlight chassis 22, the source drivers 17 can be prevented from swaying greatly even if vibrations are generated. In addition, if the face of the first heat conduction member 112, which is opposed to the outer side faces of the source drivers 17, defines an adhesive face, the flexible printed wiring boards 18 are adhered to the adhesive face, which allows the source drivers 17 held sandwiched between the bezel 11 and the backlight chassis 22 to be held in a more stable manner.

Further, when the first heat conduction member 112 defines a member having heat conductivity higher than the material from which the bezel 11 is made, a transfer amount of the heat from the source drivers 17 to the bezel 11 is increased, so that the first heat conduction member 112 can have improved heat radiation efficiency.

Figure 4:
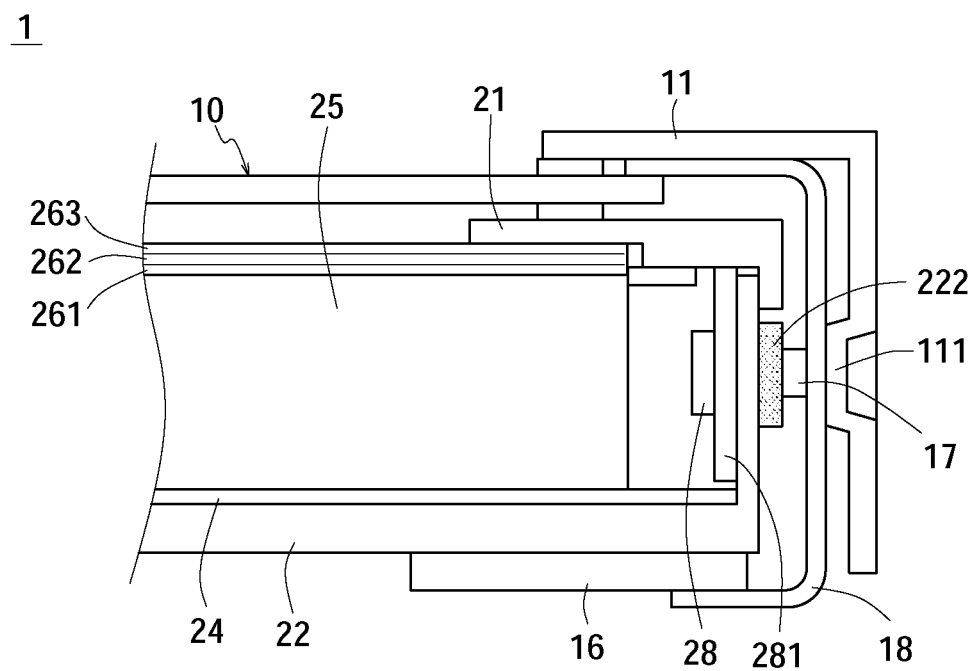
FIG. 4 is an enlarged cross-sectional view showing the liquid crystal display device of a second modification.

Next, a description of a second modification will be provided. The second modification shown in FIG. 4 defines a configuration that while the bezel 11 includes the first holding members 111 that define protrusions, the backlight chassis 22 includes no second holding member 221 (i.e., a molding process to produce protrusions is not performed), but includes a second heat conduction member 222 that is fixed to the backlight chassis 22.

A heat conductive sheet having high heat conductivity is preferably used as the second heat conduction member 222. The configuration of the second heat conduction member 222 is not limited specifically; however, it is preferable that the heat conductive sheet has heat conductivity higher than the material from which the backlight chassis 22 is made. The second heat conduction member 222 is opposed to the inner side faces of the source drivers 17 mounted on the flexible printed wiring boards 18. To be specific, the face (front face) of the second heat conduction member 222, which is opposed to the source drivers 17, is in direct contact with the inner side faces of the source drivers 17 (i.e., the faces of the source drivers 17, which are opposite to the faces on which the source drivers 17 are mounted on the flexible printed wiring boards 18). The face of the second heat conduction member 222, which is opposed to the inner side faces of the source drivers 17, is formed to be a flat face in order to increase a heat transfer area between the second heat conduction member 222 and the source drivers 17.

Also in this configuration, the heat transfer areas between the source drivers 17 and the heat radiating members are large, and heat radiation areas of the heat radiating members (transfer amounts of the heat to the air) are large, so that the liquid crystal display device 1 is capable of offering excellent radiation performance. Consequently, the liquid crystal display device 1 having this configuration is capable of preventing a rise in temperature of the source drivers 17 to prevent the source drivers 17 from malfunctioning due to heat. In addition, being held sandwiched between the second heat conduction member 222 fixed to the backlight chassis 22 and the first holding members 111 of the bezel 11, the source drivers 17 can be prevented from swaying greatly even if vibrations are generated. In addition, if the face of the second heat conduction member 222, which is opposed to the inner side faces of the source drivers 17, defines an adhesive face, the source drivers 17 are adhered to the adhesive face, which allows the source drivers 17 held sandwiched between the bezel 11 and the backlight chassis 22 to be held in a more stable manner.

Further, when the second heat conduction member 222 defines a member having heat conductivity higher than the material from which the backlight chassis 22 is made, a transfer amount of the heat from the source drivers 17 to the backlight chassis 22 is increased, so that the second heat conduction member 222 can have improved heat radiation efficiency.

Figure 5:
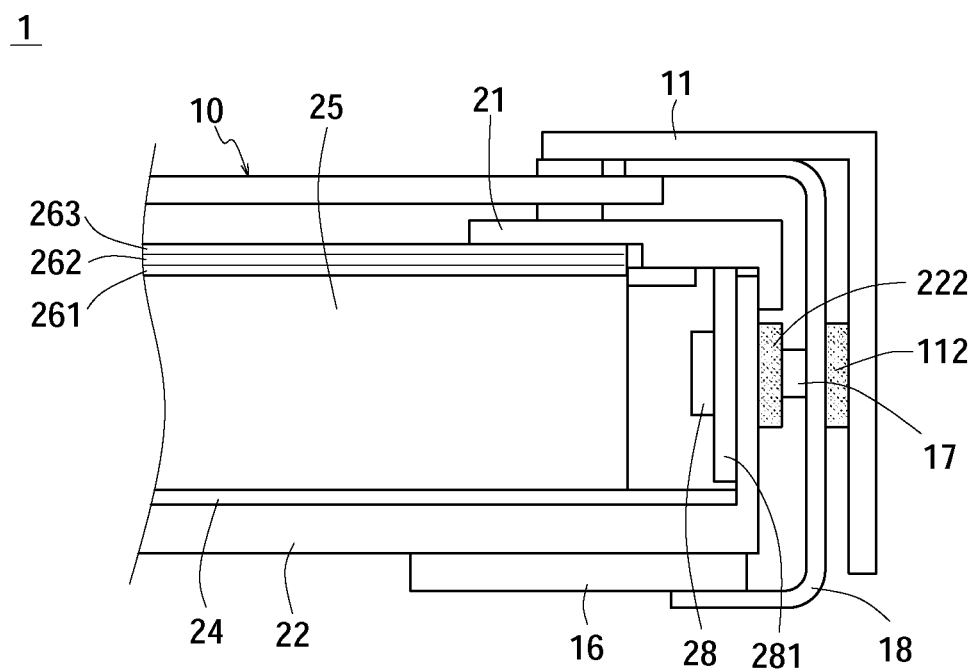
FIG. 5 is an enlarged cross-sectional view showing the liquid crystal display device of a third modification.

Next, a description of a third modification will be provided. The third modification shown in FIG. 5 defines a configuration that the bezel 11 and the backlight chassis 22 include no first holding member 111 and no second holding member 221 (i.e., molding processes to produce protrusions are not performed), but include a first heat conduction member 112 and a second heat conduction member 222 that are fixed to the bezel 11 and the backlight chassis 22, respectively. The configurations and the fixed positions of the first heat conduction member 112 and the second heat conduction member 222 are same as those of the first heat conduction member 112 and the second heat conduction member 222 described in the first and second modifications.

Also in this configuration, the heat transfer areas between the source drivers 17 and the heat radiating members are large, and heat radiation areas of the heat radiating members (transfer amounts of the heat to the air) are large, so that the liquid crystal display device 1 is capable of offering excellent radiation performance. Consequently, the liquid crystal display device 1 having this configuration is capable of preventing a rise in temperature of the source drivers 17 to prevent the source drivers 17 from malfunctioning due to heat. In addition, being held sandwiched between the first heat conduction member 112 fixed to the bezel 11 and the second heat conduction member 222 fixed to the backlight chassis 22, the source drivers 17 can be prevented from swaying greatly even if vibrations are generated. In addition, if the face of the first heat conduction member 112, which is opposed to the outer side faces of the source drivers 17, defines an adhesive face while the face of the second heat conduction member 222, which is opposed to the inner side faces of the source drivers 17, defines an adhesive face, the flexible printed wiring boards 18 are adhered to the adhesive face of the first heat conduction member 112 while the source drivers 17 are adhered to the adhesive face of the second heat conduction member 222, which allows the source drivers 17 held sandwiched between the bezel 11 and the backlight chassis 22 to be held in a more stable manner.

Further, when the first heat conduction member 112 defines a member having heat conductivity higher than the material from which the bezel 11 is made while the second heat conduction member 222 defines a member having heat conductivity higher than the material from which the backlight chassis 22 is made, a transfer amount of the heat from the source drivers 17 to the bezel 11 and a transfer amount of the heat from the source drivers 17 to the backlight chassis 22 are increased, so that the first heat conduction member 112 and the second heat conduction member 222 can have improved heat radiation efficiency.

It is also preferable to use members other than heat conductive sheets as the heat conduction members of the first to third modifications (the first heat conduction member 112 and the second heat conduction member 222). For example, Peltier devices using a Peltier effect, or heat pipes may be used as the heat conduction members.

Next, a description of a fourth modification will be provided. The fourth modification shown in FIG. 6 defines a configuration that the second holding members 221 of the backlight chassis 22 each include impelling members 2211 and regulating members 2212.

Figure 6:
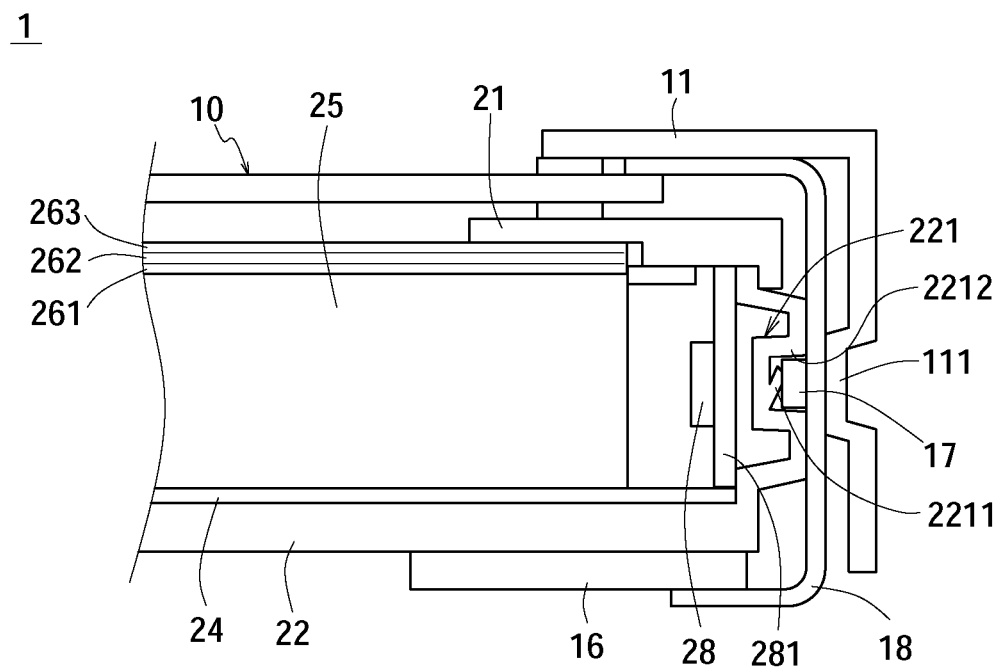
FIG. 6 is an enlarged cross-sectional view showing the liquid crystal display device of a fourth modification.

The second holding members 221 of the present modification define concave members that the backlight chassis 22 includes on its side wall, which are dented toward the inner side as shown in FIG. 6. The source drivers 17 are housed in the concave members. In addition, each concave member includes a plate spring on its bottom face, which is cut out from each concave member so as to stand toward the opening of each concave member. The plate springs function as the impelling members 2211.

In addition, each concave member has a size slightly larger than each source driver 17. To be specific, each concave member has a size such that a tiny clearance exists between the inner face of each concave member and the outer face of each source driver 17 (it is preferable to insure a clearance fit). Thus, the concave members (the inner faces of the concave members) function as the regulating members 2212 that are arranged to regulate movement of the source drivers 17.

The source drivers 17 housed in the concave members that define the second holding members 221 are being sandwiched between the bottom faces of the concave members and the front faces of the first holding member 111 of the bezel 11. Thus, the impelling members 2211 on the bottom faces of the concave members are bent to impel the source drivers 17 toward the bezel 11 (the first holding member 111). To be specific, the source drivers 17 are being held sandwiched between the first holding member 111 and the second holding member 221 while a given amount of pressure (the impelling force of the impelling members 2211) is exerted on the source drivers 17.

As described above, the impelling members 2211 of the second holding members 221 can increase the forces of the first and second housing members to sandwich the source drivers 17 therebetween, which allows the source drivers 17 to be held in a more stable manner in the present modification. Thus, the possibility of a breakdown caused to the source drivers 17 by a shock can be decreased.

In addition, because the peripheries of the source drivers 17 are surrounded by the inner faces of the concave members, the movement of the source drivers 17 is regulated (i.e., the source drivers 17 can only move within the clearances existing between the inner faces of the concave members and the outer faces of the source drivers 17), which allows the source drivers 17 to be held in a more stable manner.

Further, the second holding members 221 (the impelling members 2211 and the regulating members 2212) that define the concave members in the present modification can be easily produced so as to be of a monolithic construction with the backlight chassis 22. For example, if the backlight chassis 22 is produced through a press molding process, the production cost can be kept down because the backlight chassis 22 has a shape simple enough to be molded easily through one step of a conventional press process.

Figure 7:
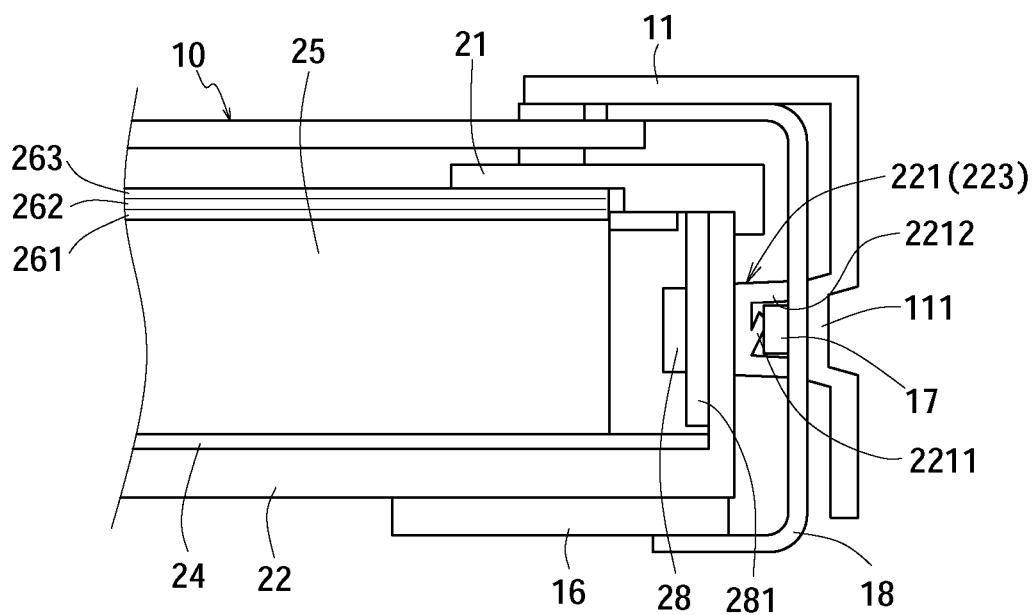
FIG. 7 is an enlarged cross-sectional view showing the liquid crystal display device of a fifth modification.

The configuration of the present modification is only an example, and modifications and variations are possible. While described in the present modification described above is the configuration that the second holding members 221 define the concave members that are dented toward the inner side, another configuration that the backlight chassis 22 includes members 223 having a concave shape in cross section as the second holding members 221, the members 223 being fixed to the outer side of the side wall of the backlight chassis 22 (a fifth modification), is also preferably used as shown in FIG. 7. In this modification, each member 223 includes a plate spring that defines an impelling member 2211 on its bottom face, which is cut out from each member 223 so as to stand toward the opening of each member 223.

It is also preferable that the impelling members 2211 and the regulating members 2212 provided to the second holding members 221 of the backlight chassis 22 are provided to the first holding members 111 of the bezel 11 (however, the source drivers 17 need to be mounted on the opposite faces of the flexible printed wiring boards 18 (the faces opposite to the faces on which the source drivers 17 are mounted in FIGS. 6 and 7)). That is, it is also preferable that the first holding members 111 have the same configuration as the second holding members 221 of the fourth modification or the fifth modification. If the first holding members 111 or the second holding members 221 have the configuration of including the impelling members 2211 and the regulating members 2212, the source drivers 17 can beheld in a more stable manner.

In addition, while described in the modification described above is the configuration that the second holding members 221 of the backlight chassis 22 include both of the impelling members 2211 and the regulating members 2212, another configuration that the second holding members 221 of the backlight chassis 22 include the impelling members 2211 or the regulating members 2212 is preferably used. For example, the source drivers 17 may be housed in the concave members that include no impelling member (plate spring) 2211.

In addition, while described in the modification described above is the configuration that the plate springs on the bottom faces of the concave members define the impelling member 2211, another configuration that coil springs provided on the bottom faces of the concave members define the impelling member 2211 is preferably used.

Figure 8:
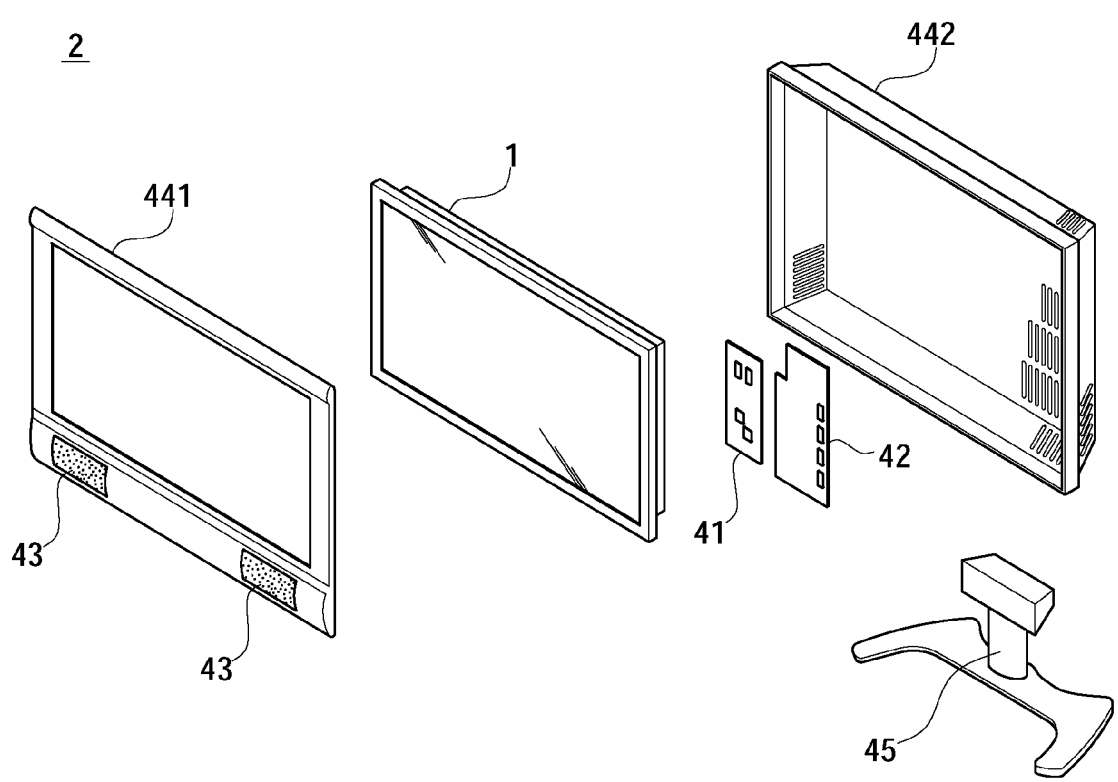
FIG. 8 is an exploded perspective view showing a schematic configuration of a television receiving device of a preferred embodiment of the present invention.

Next, a description of a television receiving device of a preferred embodiment of the present invention will be provided. FIG. 8 is an exploded perspective view showing a schematic configuration of a television receiving device 2 of the present embodiment.

The television receiving device 2 includes the liquid crystal display device 1 described above, a tuner 41, an electric power supply 42, loudspeaker units 43, a cabinet 441, a cabinet 442, and a supporting member 45 as shown in FIG. 8. A conventional tuner, loudspeaker units, electric power supply, cabinets and supporting member can be used as the tuner 41, the loudspeaker units 43, the electric power supply 42, the cabinet 441, the cabinet 442 and the supporting member 45, so that brief descriptions thereof are provided instead of detailed descriptions.

The tuner 41 is arranged to produce an image signal and a sound signal of a given channel based on a received radio wave. A conventional terrestrial tuner (analog and/or digital), a BS tuner and a CS tuner are preferably used as the tuner 41. The loudspeaker units 43 are arranged to produce a sound based on the sound signal produced by the tuner 41. Generally-used speakers are preferably used as the loudspeaker units 43. The electric power supply 42 is arranged to supply electric power to the liquid crystal display device 1 of the present embodiment, the tuner 41, the loudspeaker units 43 and other components.

The liquid crystal display device 1, the tuner 41, the loudspeaker units 43 and the electric power supply 42 are housed in the cabinet 441 and the cabinet 442, which are supported by the supporting member 45. Shown in FIG. 8 is the configuration that the cabinets define a front side cabinet 441 and a back side cabinet 442, between which the liquid crystal display device 1, the tuner 41, the loudspeaker units 43 and the electric power supply 42 are housed. Another configuration such that the tuner 41, the loudspeaker units 43 and the electric power supply 42 are incorporated in the liquid crystal display device 1 is preferably used.

The foregoing description of the preferred embodiments of the present invention has been presented for purposes of illustration and description with reference to the drawings. However, it is not intended to limit the present invention to the embodiments, and modifications and variations are possible as long as they do not deviate from the principles of the present invention.

For example, while described above is the configuration that the liquid crystal display device 1 includes the heat radiating structure arranged to prevent a rise in temperature of the source drivers 17, if the liquid crystal display device 1 includes gate drivers (shown as the gate drives 19 in FIG. 1 for reference) arranged to drive the gate signal lines of the liquid crystal display panel 10, it is also preferable that the liquid crystal display device 1 has a configuration of including a heat radiating structure arranged to prevent a rise in temperature of the gate drivers 19, which can be constructed in a similar manner to the heat radiating structure arranged to prevent a rise in temperature of the source drivers 17.

The invention claimed is:

1. A display device that comprises:
a display panel arranged to display an image;
a driver IC that is electrically connected to the display panel via a connecting member and arranged to drive the display panel; and
a housing member that comprises a case of the display device,
wherein the housing member comprises:
a first housing member that is made from metal and attached to the display panel from a front side of the panel,
a first heat conduction member and a second holding member that are opposed to each other; and
a second housing member that is made from metal and attached to the display panel from a back side of the panel, wherein
the driver IC is held sandwiched between the first housing member and the second housing member,
the driver IC is in direct contact with the first housing member,
the first heat conduction member is fixed to the first housing member,
the second housing member and the second holding member are of a monolithic construction, and
the driver IC is held sandwiched between the first heat conduction member and the second holding member.

2. The display device according to claim 1,
wherein the driver IC is mounted on one face of the connecting member that has a sheet shape, and
wherein the driver IC and the connecting member are held sandwiched between the first housing member and the second housing member.

3. The display device according to claim 1, wherein at least one of the first housing member and the second housing member comprises an impelling member arranged to impel the driver IC toward the other housing member.

4. The display device according to claim 3, wherein the impelling member comprises a plate spring, which comprises at least one of a portion of the first housing member and a portion of the second housing member, the portions being cut out from the first housing member and the second housing member to be in standing positions.

5. The display device according to claim 1, wherein at least one of the first housing member and the second housing member comprises a regulating member that is arranged to surround the driver IC to regulate movement of the driver IC.

6. The display device according to claim 5, wherein at least one of the first housing member and the second housing member comprises a concave member that comprises the regulating member, the concave member being arranged to house the driver IC to regulate movement of the driver IC.

7. The display device according to claim 1,
wherein the second holding member comprises a protrusion.

8. The display device according to claim 1, wherein a face of the second holding member, the face being opposed to the driver IC, comprises a flat face.

9. The display device according to claim 1, wherein a face of the first heat conduction member, the face being opposed to the driver IC, comprises a flat face.

10. A display device that comprises:
- a display panel arranged to display an image;
- a driver IC that is electrically connected to the display panel via a connecting member and arranged to drive the display panel; and
- a housing member that comprises a case of the display device,
- wherein the housing member comprises:
  - a first housing member that is made from metal and attached to the display panel from a front side of the panel; and
  - a second housing member that is made from metal and attached to the display panel from a back side of the panel, wherein
  - the driver IC is held sandwiched between the first housing member and the second housing member,
  - the driver IC is in direct contact with the first housing member,
  - at least one of the first housing member and the second housing member comprises an impelling member arranged to impel the driver IC toward the other housing member, and
  - the impelling member comprises a plate spring, which comprises at least one of a portion of the first housing member and a portion of the second housing member, the portions being cut out from the first housing member and the second housing member to be in standing positions.

11. The display device according to claim 10,
wherein the second holding member comprises a protrusion, and
wherein the second housing member and the second holding member are of a monolithic construction.

* * * * *